United States Patent
Drost (10) Patent No.: US 10,523,211 B2
(45) Date of Patent: Dec. 31, 2019

(54) WIDE RANGE GLITCHLESS SWITCHABLE CLOCK DIVIDER WITH MODIFIED 2/3 DIVIDER STAGES

(71) Applicant: Silicon Laboratories Inc., Austin, TX (US)

(72) Inventor: Brian G. Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/239,552

(22) Filed: Aug. 17, 2016

(65) Prior Publication Data

US 2018/0054203 A1    Feb. 22, 2018

(51) Int. Cl.
*H03K 21/38* (2006.01)
*H03K 21/02* (2006.01)

(52) U.S. Cl.
CPC .......... *H03K 21/38* (2013.01); *H03K 21/026* (2013.01)

(58) Field of Classification Search
CPC ....... H03K 21/38; H03K 21/026; H03K 23/66
See application file for complete search history.

(56) References Cited

U.S. PATENT DOCUMENTS

| | | | |
|---|---|---|---|
| 4,193,037 A | 3/1980 | Kyu | |
| 4,866,741 A | 9/1989 | Minuhin | |
| 4,935,944 A | 6/1990 | Everett | |
| 7,564,276 B2 * | 7/2009 | Narathong | H03K 23/54 327/115 |
| 8,552,770 B2 | 10/2013 | Cavin | |
| 9,118,333 B1 * | 8/2015 | Mika | H03K 23/70 |
| 2014/0312936 A1 * | 10/2014 | Abdel-Haleem | H03L 7/193 327/118 |

OTHER PUBLICATIONS

Eissa, M. and El-Shennawy, M., "A Technique for Robust Division Ration Switching in Multi Modulus Dividers with Modulus Extension," 22nd International Conference on Microelectronics (ICM 2010), 4 pages.
Musch, T., "Investigations on fast, low power frequency dividers," Institute of Electronic Circuits, RUHR Universität, Aug. 10, 2015, 1 page.
Vaucher, C., et al., "A Family of Low-Power Truly Modular Programmable Dividers in Standard 0.35-µm CMOS Technology," IEEE Journal of Solid-State Circuits, vol. 35, No. 7, Jul. 2000, pp. 1039-1045.

* cited by examiner

*Primary Examiner* — Lincoln D Donovan
*Assistant Examiner* — Colleen J O Toole
(74) *Attorney, Agent, or Firm* — Zagorin Cave LLP (57) ABSTRACT

A divider includes ⅔ divider stages that may be turned off without toggling to extend the divide range of the divider while also reducing the impact of spurs on the divider output, and preserving the timing margin to update the divide ratio glitchlessly. A ⅔ divider stage responds to an input enable signal being deasserted and a modulus input signal being asserted to remain in a disabled state in which the divider stage does not toggle by ensuring storage elements outputs in the divider stage remain constant. The divider further selects an update clock for the divide ratio of the divider utilizing an output from a most downstream stage that remains enabled.

16 Claims, 11 Drawing Sheets

| Truth Table for State $0_1$ | | | |
|---|---|---|---|
| ena | skip | mod_in | Next State |
| 0 | 0 | 0 | $1_1$ |
| 0 | 0 | 1 | $0_1$ |
| 0 | 1 | 0 | $1_1$ |
| 0 | 1 | 1 | $0_1$ |
| 1 | 0 | 0 | $1_1$ |
| 1 | 0 | 1 | $1_1$ |
| 1 | 1 | 0 | $1_1$ |
| 1 | 1 | 1 | $1_0$ |

WIDE RANGE GLITCHLESS SWITCHABLE CLOCK DIVIDER WITH MODIFIED 2/3 DIVIDER STAGES

BACKGROUND

Field of the Invention

This application relates to dividers and more particularly to dividers using 2/3 divider stages.

Description of the Related Art

Dividers are used for many different applications. For example, divider applications include programmable dividers, multi-modulus dividers in fractional-N phase-locked loops, and integer dividers in interpolating dividers.

Figure 1A:
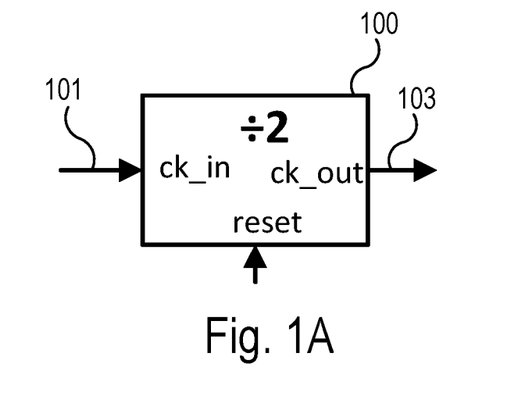
FIG. 1A shows a high level representation of a divide-by-two divider.
Figure 1B:
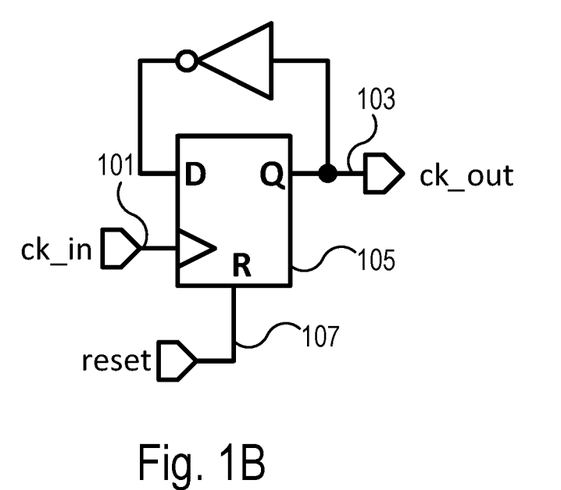
FIG. 1B shows one implementation of a divide-by-two divider using a flip-flop feeding back an inverted flip-flop output.
Figure 1C:
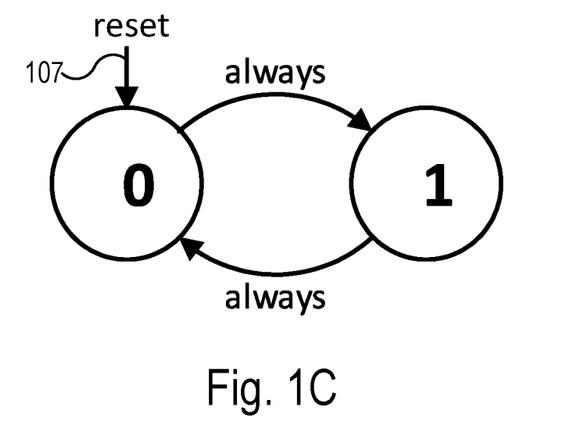
FIG. 1C shows a state machine associated with the divider of FIG. 1B.

Dividers range from simple divide-by-two circuits to more complex dividers utilized, e.g., as multi-modulus dividers. FIGS. 1A-1C illustrate a basic divide-by-two divider 100. FIG. 1A shows a high level representation of a divider that divides by two. The input signal (ck_in) 101 is divided by 2 and supplied as the output signal ck_out 103. FIG. 1B illustrates an implementation of the divider 100 in which the output 103 is inverted and fed back to the input of the flip-flop 105. FIG. 1C shows a state machine illustrating operation of the divider circuit. A reset signal 107 causes the divider to enter a state with the Q output of flip-flop 105 reset to 0. Each subsequent rising edge of the clock signal received by the flip-flop 105 causes the divider to toggle between 1 and 0, thus halving the frequency of the output signal.

While the divider 100 illustrates a simple divide-by-two, many dividers have more complex requirements, e.g., the ability to change the divide ratio. Such dividers may be utilized where the divide ratio may be programmed by the customer, either permanently or on the fly. Many clock dividers run at high frequencies and need to switch between frequencies without glitching. One approach is to use a synchronous counter, but that approach is slow and has low scalability. Scalability is the ability to increase the maximum divide value without having to decrease the maximum input frequency.

Figure 2:
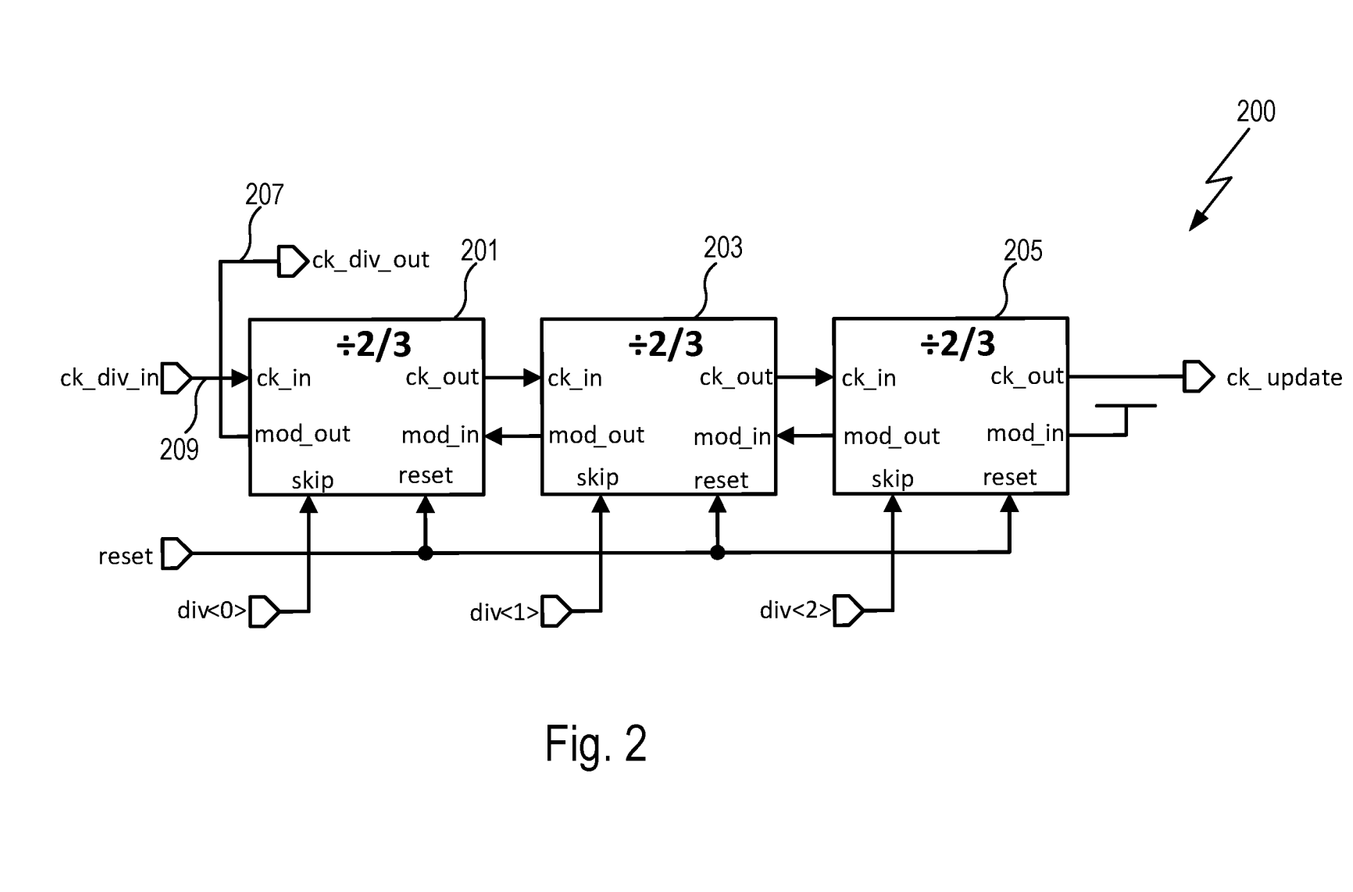
FIG. 2 illustrates a ⅔ divider chain.

FIG. 2 shows an approach to provide a divider that can change divider ratios. FIG. 2 illustrates a divider architecture 200 that includes a chain of divide 2/3 stages that can achieve higher speeds with very good scalability and has been used in many applications. Each divider stage 201, 203, and 205 can be set to a divide by 2 or divide by 3. The divider chain operates as follows. Once in an output period of the divider chain 200, a modulus control signal (mod_out) is generated by a divider stage, which control signal is supplied upstream to an adjacent divider stage as mod_in. Each divider stage includes a skip input (div<n>) that corresponds to one bit of a divide ratio. The skip input informs the divider stage whether to add one period of its input clock to the period of the output clock. In other words, the stage is configured to divide by three once during the period of the output clock. By linking them as shown, each stage only performs one divide-by-3 operation per period of the output clock 207 (ck_div_out). Essentially, that means the first stage may be used to add one extra input clock 209 (ck_div_in) period to the output clock's period, the second stage is used to add two extra input clock (ck_div_in) periods, and so on, when the corresponding skip input for that stage is asserted.

The divide by three occurs when skip is enabled and mod_in for that particular stage is asserted. In that way, the three stage divider 200 shown in FIG. 2 can achieve divide ratios of 8-15 or $2^n$ to $(2^{n+1}-1)$, where n is the number of divider stages. In terms of the divide ratio, the divider 200 achieves a divide ratio of 8+div<2:0>.

Figures 3, 4:
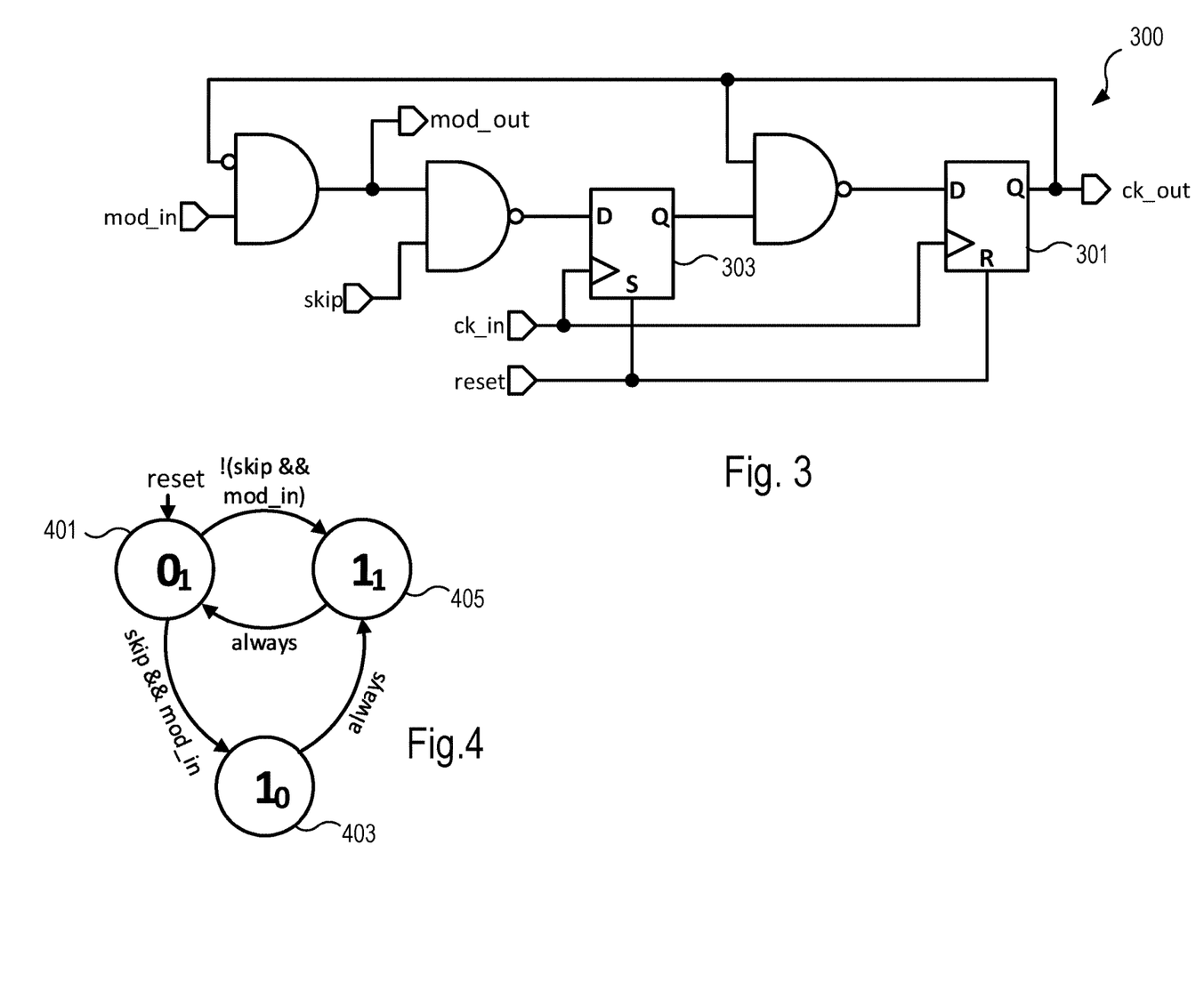
FIG. 3 illustrates an implementation of one of the stages of the ⅔ divider chain of FIG. 2.
FIG. 4 illustrates a state machine associated with the divider stage of FIG. 3.

FIG. 3 shows a divider stage 300 that implements a divider stage of the divider chain 200. FIG. 4 illustrates a state machine associated with the divider stage 300. The large number in state 401 represents the output of flip-flop 301 and the small number in each state represents the output of flip-flop 303. As shown in the state machine of FIG. 4, the divide by three is achieved when both skip and mod_in are asserted when in state 401, causing the state machine to go to state 403 for one cycle of the input clock for that stage and then to go to state 405 for the next cycle of the input clock for that stage.

One limitation of the divider shown in FIG. 2, is the limit of the divider range. One way to increase the divider range is to force a downstream stage to output an asserted mod_out signal, thereby appearing to shorten the divider chain. Thus, for example, if stage 205 always outputs an asserted mod_out signal, the chain appears to be only two stages long, thereby extending the divide range. Such an approach is described in "A Family of Low-Power Truly Modular Programmable Dividers in Standard 0.35-μm CMOS Technology," by Cicero Vaucher in IEEE Journal of Solid-State Circuits in July, 2000. U.S. Pat. No. 8,552,770 has a similar goal of expanding the divide ratio range and describes an approach where instead of disabling stages, the bottom stages operate as divide-by-1 stages. While those approaches address certain limitations associated with 2/3 dividers, further improvements in 2/3 dividers are desirable.

SUMMARY OF EMBODIMENTS OF THE INVENTION

Accordingly, in one embodiment, a divider includes a plurality of 2/3 divider stages configured in a divider chain. A divider stage of the 2/3 divider stages is responsive, in part, to a deasserted input enable signal to remain in a disabled state in which the divider stage does not toggle by having outputs of storage elements in the divider stage remain constant. A divide range of the divider chain is extended when the divider stage is disabled. An embodiment allows an update clock signal that updates the divide ratio to be provided from a most downstream stage that is not disabled to allow for changing the divide ratio without causing clock glitches.

In another embodiment, a method of operating a divider with a plurality of 2/3 divider stages includes disabling a divider stage of the 2/3 divider stages responsive to an input enable signal being deasserted to thereby extend a divide range of the divider and keeping signals generated by storage elements in the disabled divider stage from toggling when disabled.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The technique described by Vaucher et al. above for getting around the divide range limitation $2^n$ to $(2^{n+1}-1)$ does not completely shut off the downstream stages. That means the downstream stages still draw current and cause a spur on the output clock. As the supply voltage for the divider has series resistance (unlike an ideal supply), pulling current through that resistance will cause the supply to modulate resulting in the spur on the output clock. Nor was a scheme provided for glitchlessly switching divide ratios. The approach of using divide by one stages consumes additional current and adds extra delay that limits the ability to change divide ratios glitchlessly at high input frequencies.

Embodiments described herein shut off downstream stages, which prevents spurs, and provides the circuitry necessary to glitchlessly switch between any two valid divide ratios. A benefit of the modified divider stage described herein is that a chain of modified divide ⅔ stages is no longer limited in its divide ratio to $2^n$ to $(2^{n+1}-1)$ while also reducing the impact of spurs on the divider output, and preserving the timing margin to update the divide ratio glitchlessly. Such a modified ⅔ divider can be used in a variety of applications such as a multi-modulus divider in a fractional-N phase-locked loop, as an integer divider in an interpolating divider, and as a divider that can switch frequencies on the fly glitchlessly.

For example, a divider according to an embodiment operates from divide ratios of 8 to 255 and can switch between any of them glitchlessly. Embodiments described herein may not produce a 50% duty cycle, but various known techniques can be used to fix the duty cycle if desired.

In order to provide greater flexibility in divide ratios (wider than $2^n$ to $(2^{n+1}-1)$), it is necessary to disable downstream stages such that the down stream stage(s) acts as if they are no longer part of the divide chain. To limit the impact of spurs on the divider output, disabled stages should not toggle (which would make spurs) and should produce a constant modulus output (mod_out) of 1.

Figure 5:
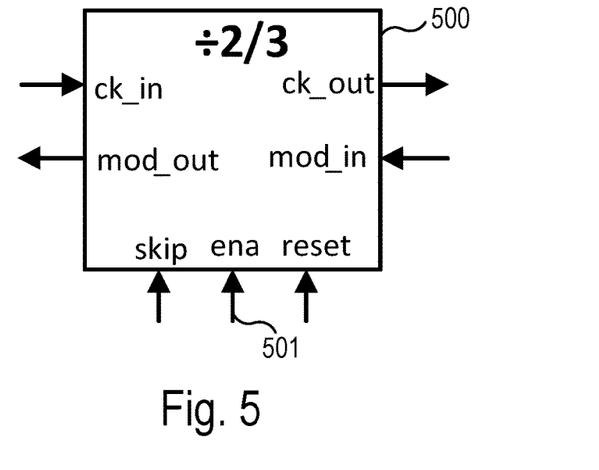
FIG. 5 shows a high level representation of a ⅔ divider according to an embodiment.

Embodiments herein provide disabled stages that do not toggle by modifying the behavior of the stages. Referring to FIG. 5 a modified ⅔ divider stage 500 is shown according to an embodiment. The divider stage 500 has an extra enable (ena) input 501 as compared to the divider stages of divider chain 200. The divider stages shown in FIG. 5 follows the state diagram shown in FIG. 6A. FIG. 7 shows an embodiment of a divider stage that implements the state diagram shown in FIG. 6A.

Figure 6A:
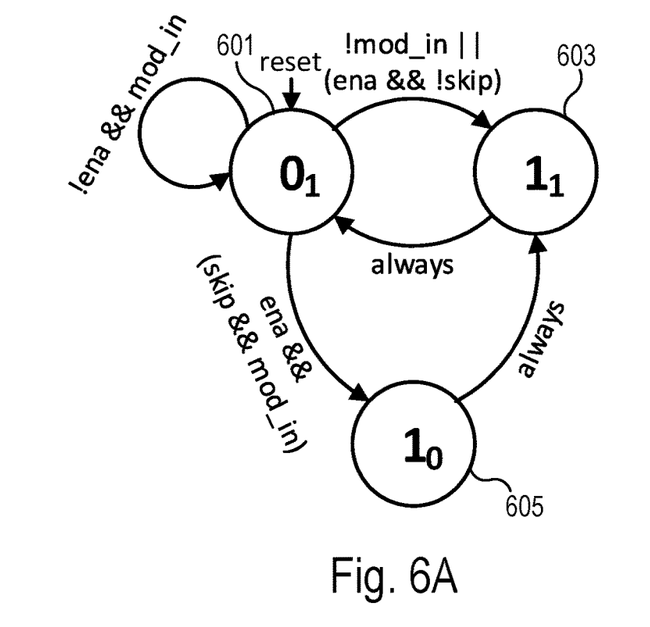
FIG. 6A illustrates a state machine associated with the ⅔ divider of FIG. 5.
Figure 6B:
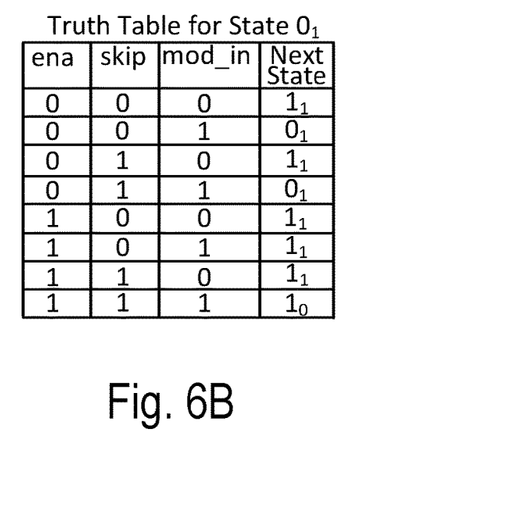
FIG. 6B illustrates a truth table for state 01 for the state machine shown in FIG. 6A.
Figure 7:
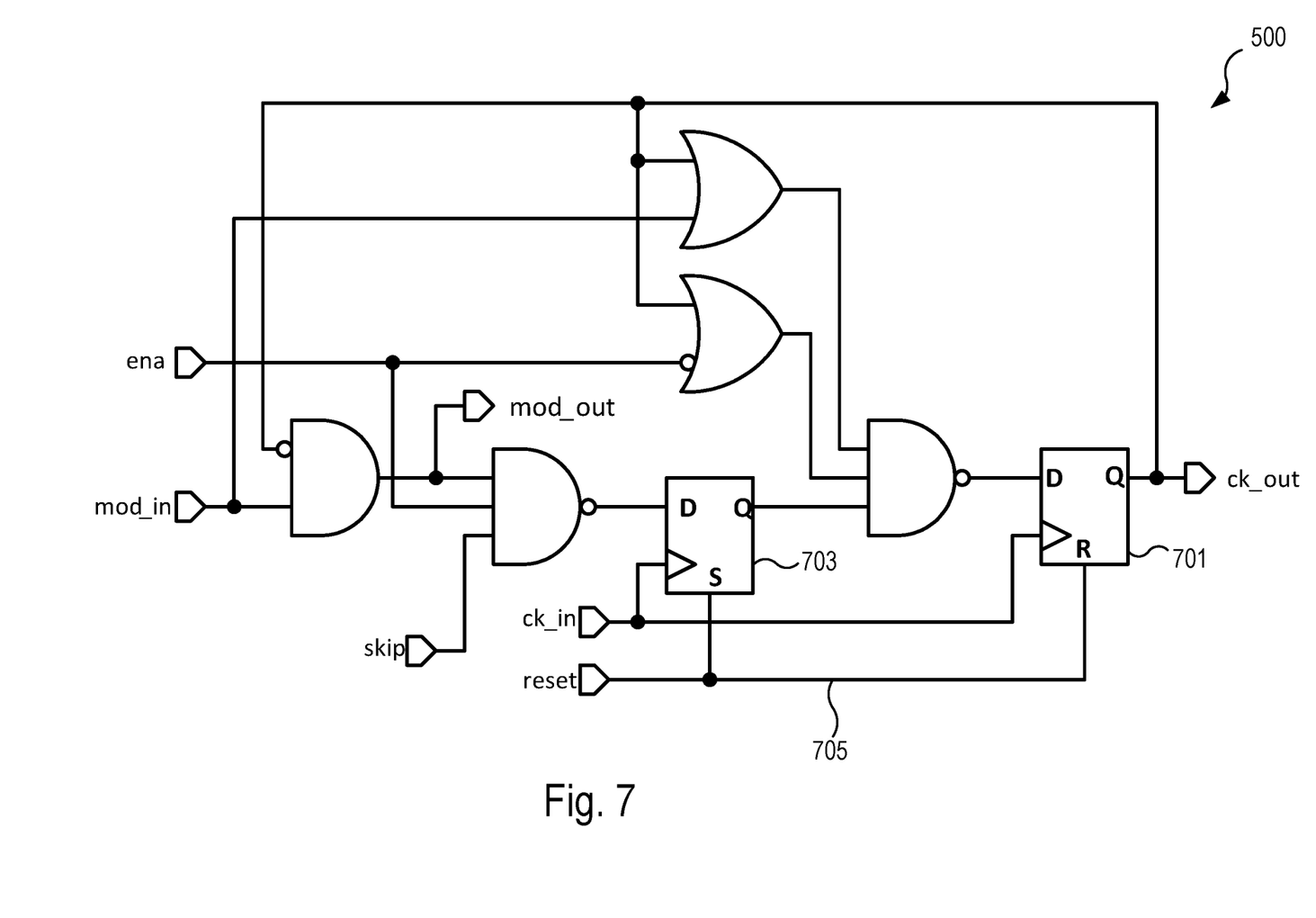
FIG. 7 illustrates an embodiment of a ⅔ divider stage in accordance with the state machine of FIG. 6A.

Referring to FIGS. 6A and 7, the large number in the state diagram is the value of the stage's output clock (ck_out) from flip-flop 701. The small number is the output from flip-flop 703. FIG. 6B shows a truth table for state 01.

In the state diagram shown in FIG. 6A, deasserting enable (ena) causes the stage to stay in the 01 state 601 once the downstream state asserts its mod_out signal so the mod_in signal input to the stage is asserted. Staying in the 01 state is the desired behavior because this is the state where the stage meets the requirements for being "disabled" and not toggling. In this state, as shown in FIG. 7, which is also entered when the reset input is asserted, the Q output of the flip-flop 701 remains at 0. Assuming the ena signal is deasserted, the state machine needs mod_in from the downstream stage to be asserted to remain in the 01 state because the downstream stage needs to be shutoff before the current stage can be shutoff. Otherwise, the downstream stage loses the clock from the current stage before it enters the 01 "disabled" state. As shown in the truth table, the state diagram, and the embodiment of FIG. 7, when the stage is disabled and mod_in is asserted (!ena && mod_in), the stage remains in the 01 state. If mod_in is not asserted and enable is deasserted (!ena) the next state is the 11 state 603. If enable is asserted and skip and mod_in are asserted (ena && (skip && mod_in) the next state is the 10 state 605, followed by state 11 and 01, resulting in the divide by 3. Note that if enable is asserted and skip is disabled (ena && !skip), then a divide without a skip is implemented by going to state 11 and then returning to state 01, regardless of the state of mod_in. Thus, the deasserted enable signal (!ena) ensures that storage elements in disabled stages do not toggle thereby avoiding spurs otherwise associated with extending the divider range.

Figure 8:
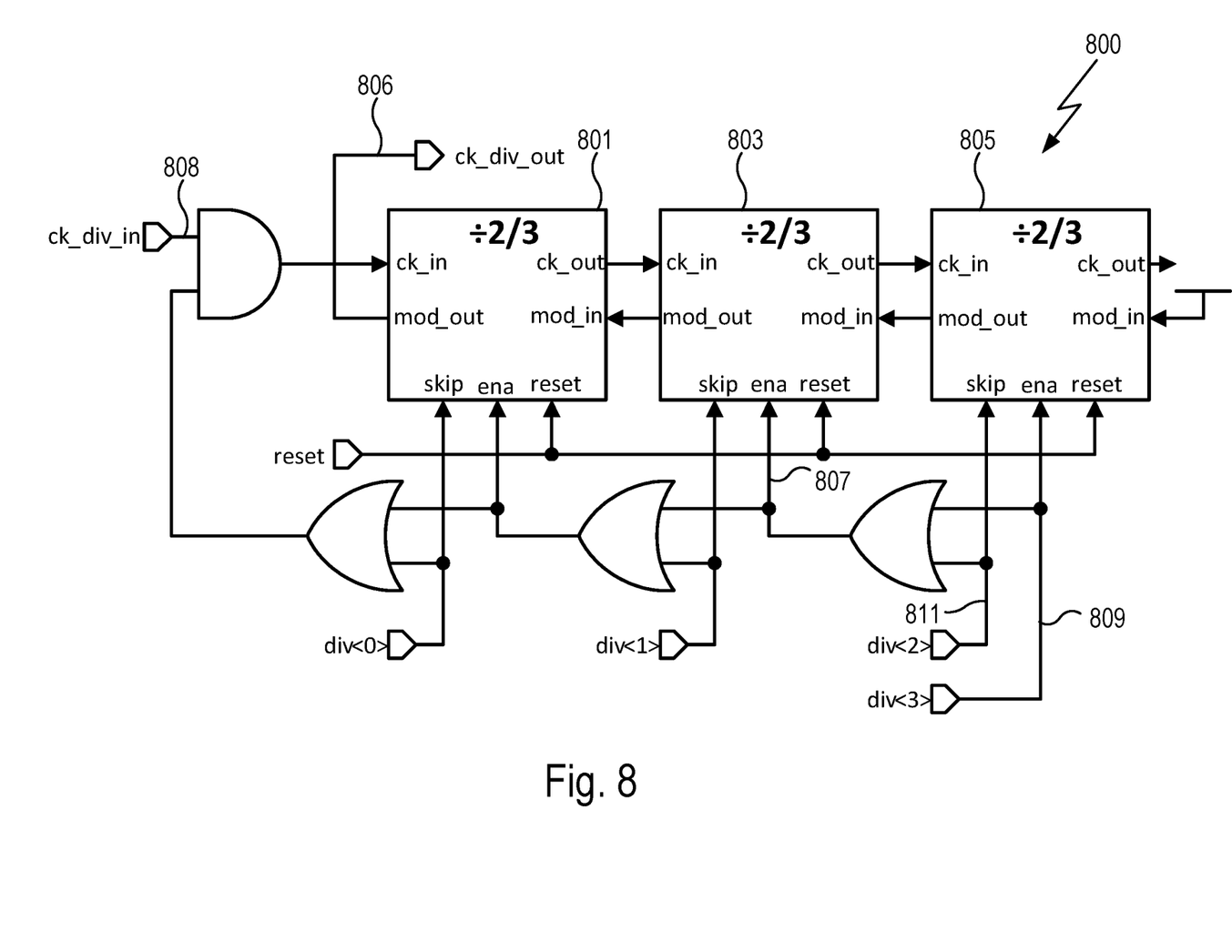
FIG. 8 illustrates an embodiment of how enables are determined and supplied to the stages of the ⅔ divider chain.

Decoding is required to ensure that, when a stage is disabled, all downstream stages are also disabled. FIG. 8 illustrates an embodiment showing how that decoding may be accomplished. In FIG. 8 the divider 800 has three divider stages 801, 803, and 805 and has a four bit divide ratio div<3:0> that determines the divider output. The divider shown in FIG. 8 can support divide ratios between 0 and 15. A divide by zero disables the divider. If the divider code is set to 1, then all three stages are disabled and all of the mod_out signals are always 1. A divide-by-1 may be implemented by using ck_div_out 806 to gate (with an AND gate) ck_div_in 808 to produce a clock with one half period pulses which can implement a divide-by-1. The divider 800 produces 1-period pulses every n-periods. If n is 1, then the "clock" is always high. A divide-by-2 stage may be placed downstream to fix the duty cycle (if a 50% duty cycle is desired), but also doubles the divide ratio so only even integers are obtained. If this divide-by-2 stage is a toggle flip-flop operating off ck_div_in 808 that toggles when ck_div_out 806 is high, then this also will produce the correct divide ratio in the divide-by-1 case.

In the embodiment of FIG. 8 the enable input (ena) for each stage (except the most downstream stage) is a logical combination of the enable input from the adjacent downstream stage and the skip_ena for the adjacent downstream stage. For example, the enable input 807 for the divider stage 803 is an OR of the enable input 809 (div<3>) and the skip input 811 (div<2>). The most downstream stage 805 uses the most significant bit of the divide ratio, here div<3> as the enable input. The number of leading zeros in the divide ratio determine which stages are enabled. For example, if div<3> is zero, the divider stage 805 is disabled. If div<2> is also zero, then the enable 807 is zero and the divider stage 803 is also disabled. In that way, the divide ratio can be extended by turning off divider stages while the disabled divider stages, as can be seen in FIGS. 6A and 7, do not toggle. When disabled, the output of the storage elements (flip-flops 701 and 703) do not toggle and as long as inputs to the stage (other than ck_in) do not change the signals in the stage remain the same. The signal ck_in will change if the stage is the most upstream disabled state since the adjacent upstream stage is enabled but the change in ck_in will not cause either of the flip-flops in the disabled stage to change state.

Figure 9:
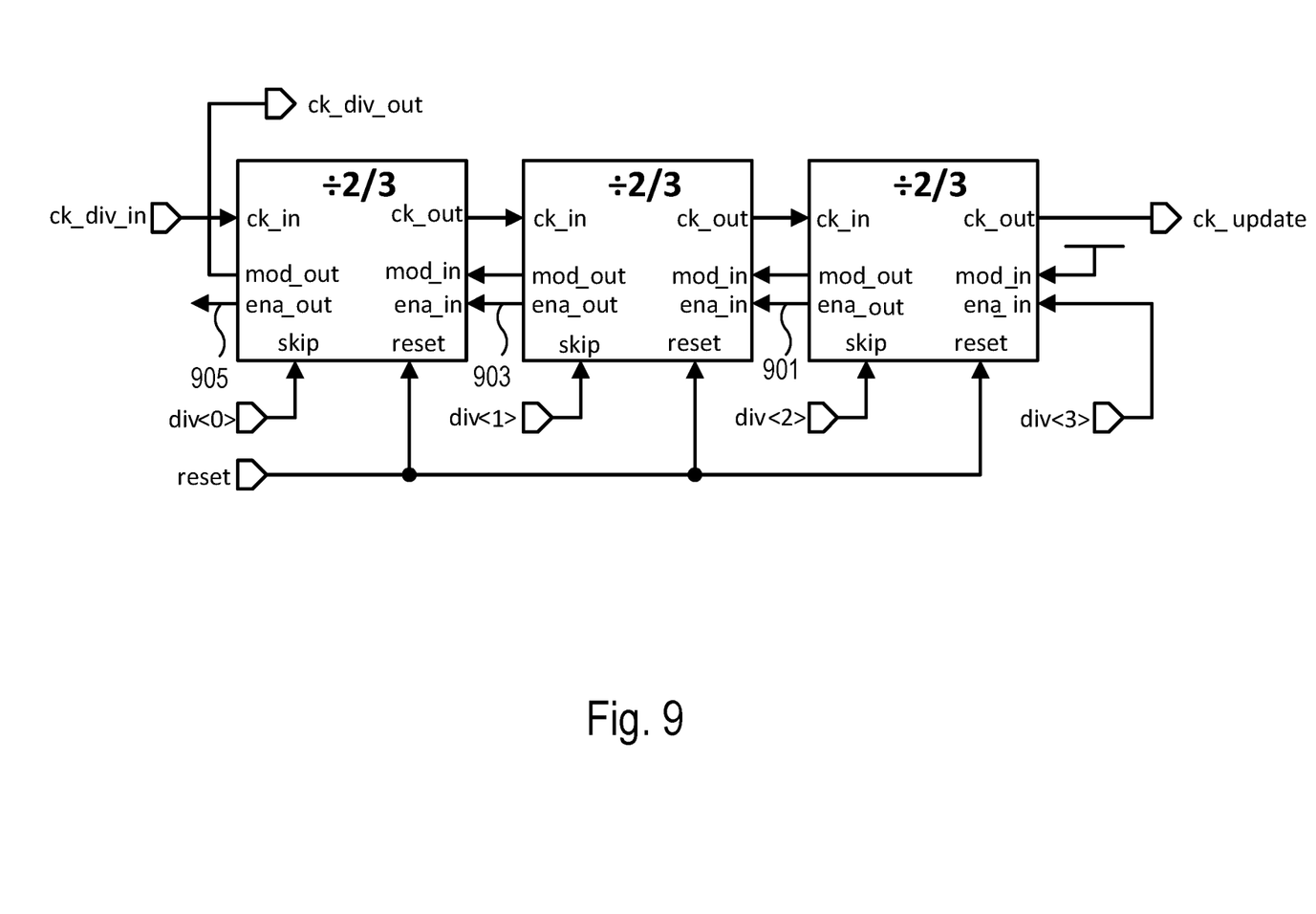
FIG. 9 illustrates how modified ⅔ divider stages, such as shown in FIG. 7, can be combined with one or more traditional ⅔ divider stages.

FIG. 9 shows an embodiment where each stage is modularized so that all the decoding to disable and enable stages is taken care of within the stages and the only inputs for each stage are the divide ratio signal, the mod_in signal, the skip signal, and the input clock (ck_in). Ena_out 901, 903, and 905 are calculated as shown in FIG. 8 but because the decoding to disable and enable stages is taken care of within the stages the divider chain can be increased by adding another divider stage without any additional logic.

Figure 10:
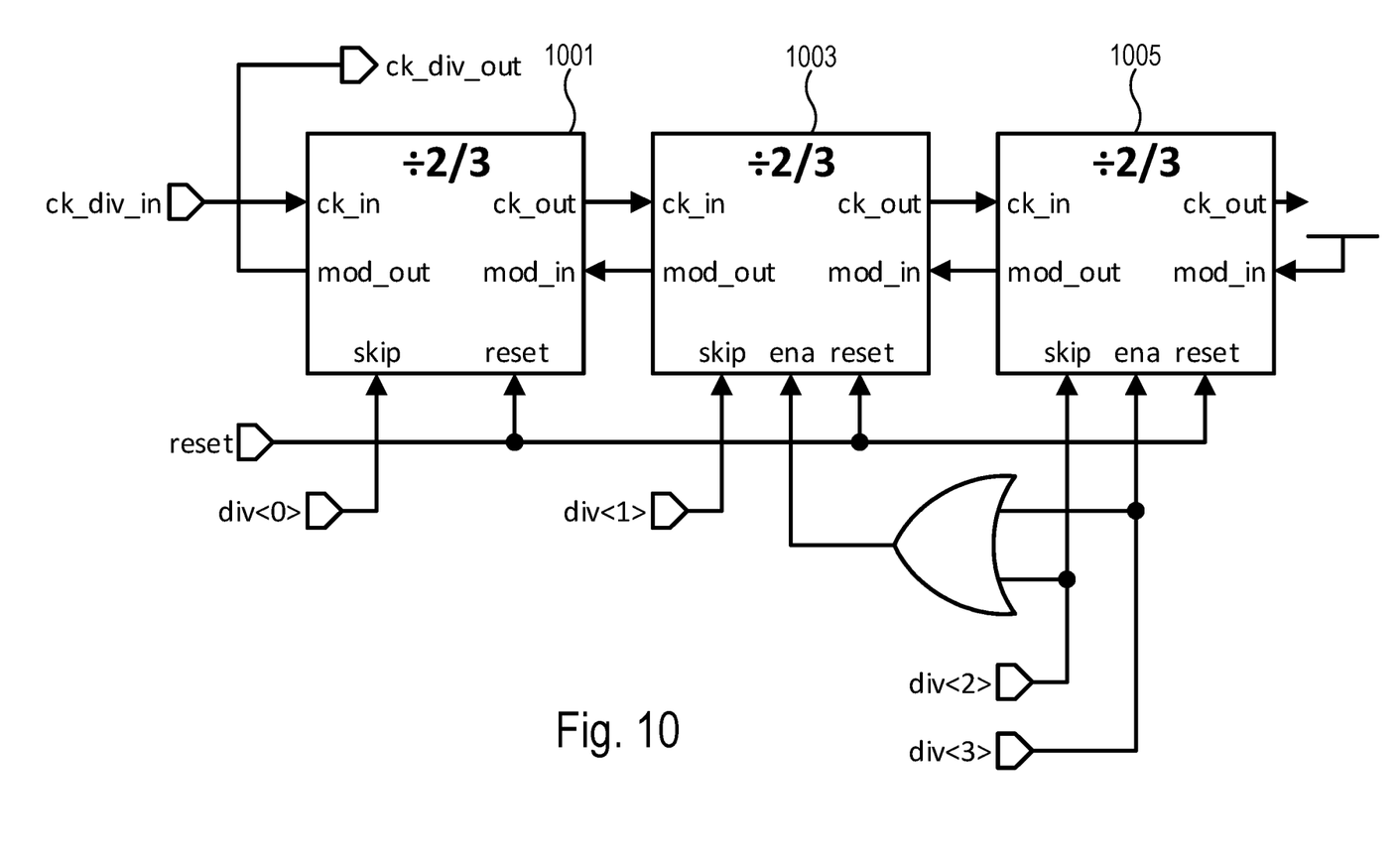
FIG. 10 illustrates a modular approach to the ⅔ divider chain shown in FIG. 8.

Referring to FIG. 10, an embodiment shows that modified ⅔ divider stages 1005 and 1003 with enable inputs may be combined with a more traditional ⅔ divider stage 1001 that lacks the enable/disable functionality of the other stages. The divider supports divide ratios between 2-15 since the first stage has no enable input.

Figure 11:
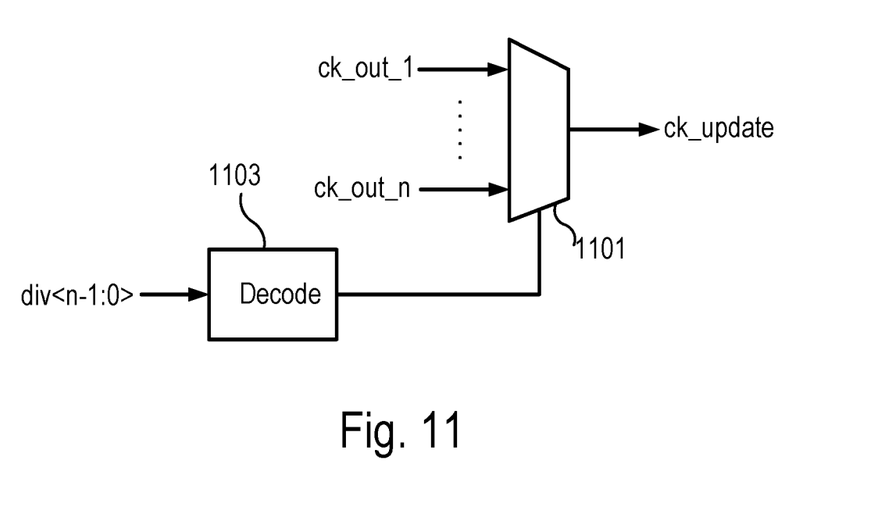
FIG. 11 illustrates an embodiment for selecting an update clock for a divider chain with potentially disabled divider stages using a multiplexer.

When the divide ratio is updated it is desirable to update with the maximum timing margin available. It turns out that the ck_out signal from the most downstream enabled stage is optimal from a timing margin perspective for updating the divide ratio. However, when a stage is disabled, the disabled stage can no longer supply the update clock signal as the ck_out signal stays deasserted. Instead, the update clock needs to be tapped off of the last enabled stage for optimal update timing margin. Referring to FIG. 11, in one embodiment, a multiplexer 1101 may be used to select the desired ck_out signal (out of n ck_out signals) as the divide ratio update signal ck_update to maintain the maximum timing margin in dividers with wide divide ratios. The selection is based on a decode 1103 of the divide ratios since the divide ratios determine which of the stages are in the disabled state. The ck_out signal from the most downstream enabled stage is selected to supply the update signal to update the divide ratios and thereby maintain the maximum possible timing margin for updating the divide ratio regardless of the number of stages disabled.

While FIG. 11 shows one implementation for selecting an update clock signal, that particular solution may not lend itself well to a modular approach as the multiplexer 1101 would have to change with each change in the divide chain length. Accordingly, referring to FIG. 12A, in another embodiment, the modulus output signal (mod_out) is used as a basis for the update clock. A standard ⅔ chain (see divider 200 in FIG. 2) uses ck_out of the most downstream stage as the update signal (ck_update). For stage 205 in the standard chain, mod_in is always 1 and therefore the inversion of mod_out (mod_out_inv) is always equal to ck_out. The embodiment relies on the fact that, for each stage, mod_out can only be 1 if mod_in is 1. In other words, the mod_out pulse comes only once each period of the output clock and fits within a mod_in pulse. That property is not true for ck_in and ck_out because ck_in toggles multiple times each ck_out period.

Figure 12A:
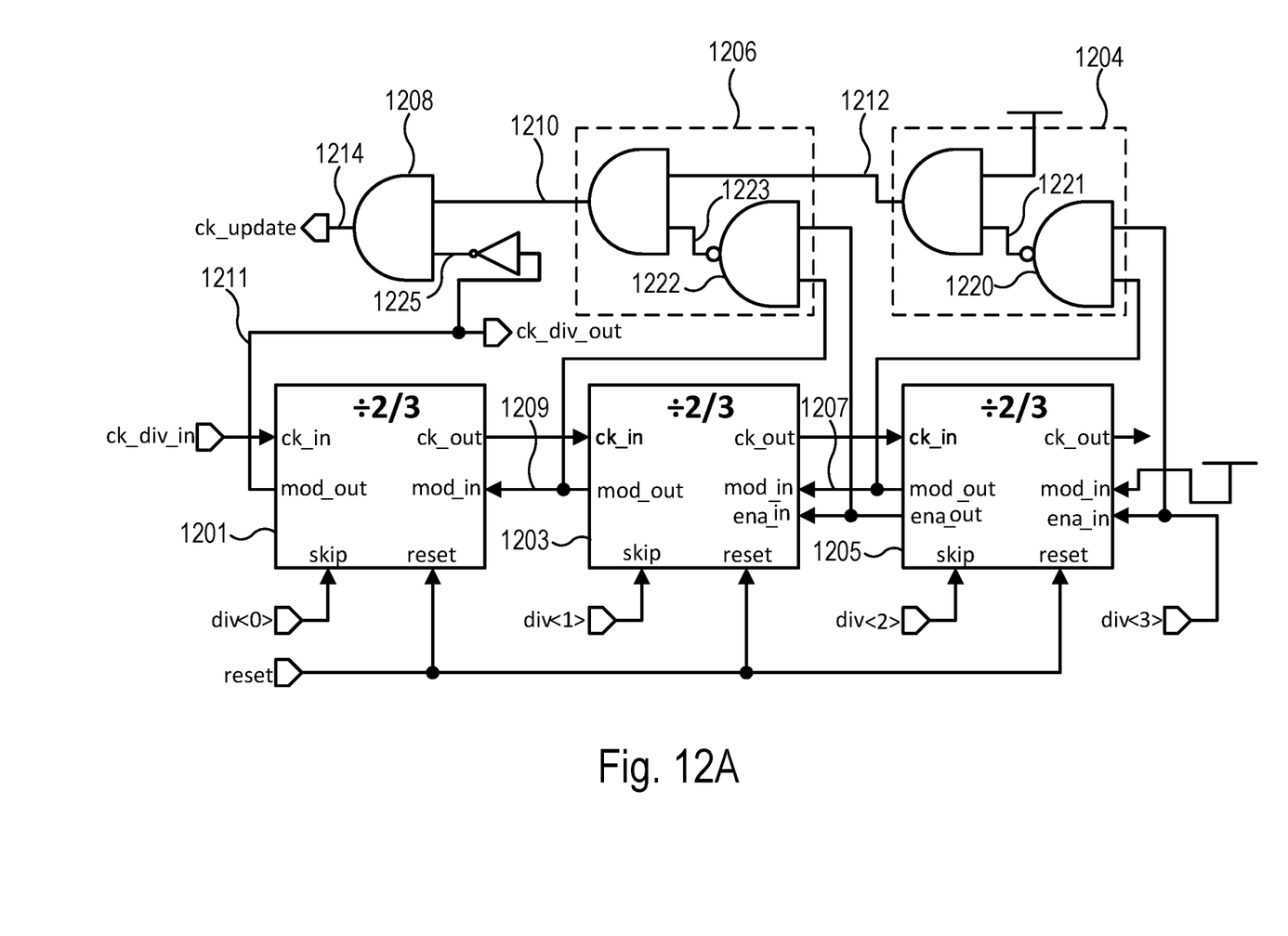
FIG. 12A illustrates an embodiment for selecting an update clock for a divider chain with potentially disabled divider stages.
Figure 13:
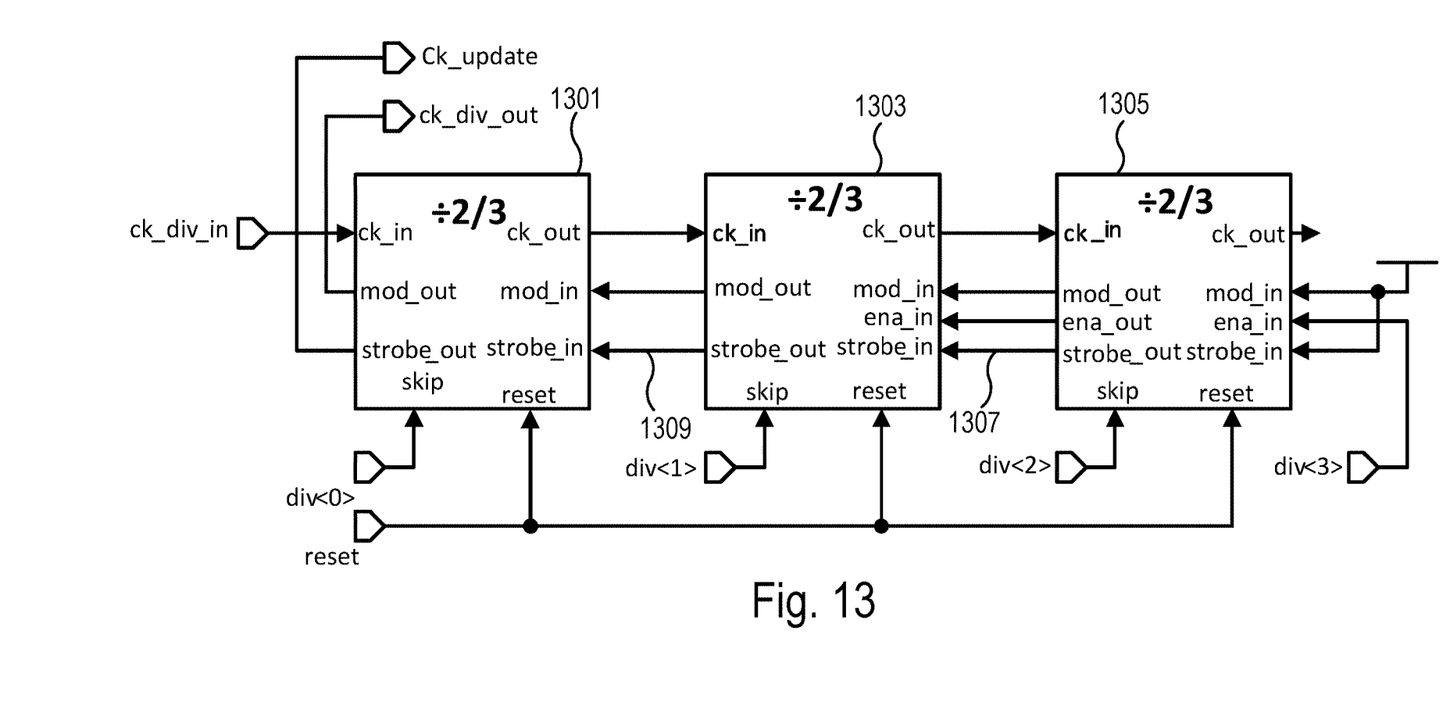
FIG. 13 illustrates a modular embodiment for selecting an update clock for a divider chain with potentially disabled divider stages.

Thus, the modulus output signal is close to the timing of the ck_out signal and is useful for the embodiment shown in FIGS. 12A and 13. The divide chain shown in FIG. 12A includes divider stage 1201, divider stage 1203, and divider stage 1205. The ck_update signal 1214 is used to update the divide ratio bits, here div<3:0> and is based on the mod_out signal from the most downstream enabled stage. When a stage is disabled, the disabled stage can no longer supply the update clock signal as the mod_out signal of the disabled stage stays asserted. Instead, as with the embodiment of FIG. 11 with the multiplexer, the update clock needs to be tapped off of the last enabled stage for optimal update timing margin. That can be accomplished with additional decoding logic in each stage that either chooses the current stage's mod_out signal if the downstream stage is disabled or passes through the update clock from the downstream stage if the downstream stage is enabled.

Figure 12B:
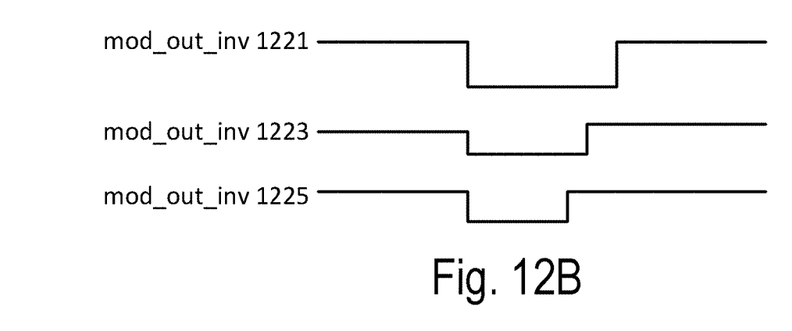
FIG. 12B illustrates a timing diagram associated with generation of the update clock.

FIG. 12A illustrates an embodiment of decoding logic that ensures that an output of the most downstream enabled stage is used as the update clock for the divide ratio. Note that the most upstream stage 1201 does not have an ena_in and the divide ratio is 2-15. If stage 1205 is enabled, logic 1204 passes the inversion (mod_out_inv) 1221 of mod_out signal 1207 from divider stage 1205 to logic 1206. The inversion is due to the use of the NAND gate 1220 in logic 1204. Logic 1206 then passes signal 1210 (same as mod_out_inv 1221) to AND gate 1208, which in turn supplies ck_update 1214. The use of mod_out_inv from the most downstream enabled stage to generate the update clock signal takes advantage of the property that the mod_out signal from an adjacent upstream stage fits within the mod_out signal from the adjacent downstream stage. That property is illustrated in FIG. 12B where the downstream mod_out_inv 1221, and mod-out_inv 1223 and mod_out_inv 1225 are illustrated. Note that FIG. 12B shows the timing of ideal stages with no delays. With real delays, the falling edges of the mod_out_inv signals come one right after another due to the clock-to-q delays of the flip-flops such that the smaller pulses fit just inside the larger pulses.

If the stage 1205 is disabled, logic 1204 passes a high logic level (logic 1) to logic 1206. If stage 1203 is enabled (and stage 1205 disabled), the logic 1206 passes the inversion 1223 of mod_out signal 1209 from stage 1203 to AND gate 1208. The inversion is due to the use of the NAND gate 1222 in logic 1206. If stage 1203 is also disabled, logic 1206 passes a logic 1 to AND gate 1208 and mod_out signal 1211 from stage 1201 provides the update clock.

From a timing standpoint, ck_out is better as the update clock than mod-out_inv because there is the delay of an extra NAND gate if mod_out_inv is used. However, for the logic in the embodiment of FIG. 12A to work, mod_out_inv needs to be used and the logic used allows the use of modular stages as shown in FIG. 13. The mod_out signal from a divider stage is close to its inverted ck_out signal (ck_out_inv) except that all pulses except one per period have been gated. That means mod_out_inv is actually closer to ck_out than ck_out_inv. Assuming use of the rising edge for updating the divide ratio, for the embodiment of FIG. 11 it is desirable to select one of the ck_out signals from the stages as shown on FIG. 11 as the update clock. However, for the embodiment of FIG. 12A, mod_out_inv is desired.

FIG. 13 shows a divider embodiment in which the clock update decoding is brought into each stage to provide modularity. FIG. 13 shows a divider supporting a division ratio of 2-15 that provides glitchless switching by selecting the mod_out_inv signal from the most downstream enabled stage as the divide ratio update signal, where mod_out_inv represents the inverted value of mod_out. The divider includes stages 1301, 1303, and 1305. Referring to FIGS. 12A and 13, the strobe_out signal 1307 supplied from stage 1305 corresponds to the output signal 1212 from logic 1204 and is the strobe_in signal to stage 1303. Similarly, the strobe_out signal 1309 from stage 1303 corresponds to the output signal 1210 from logic 1206. In other words, each stage incorporates the logic 1206 to generate the strobe_out signal based on the strobe_in signal, the mod_out signal, and the enable in signal as shown in FIG. 12A. In that way, glitchless switching can be provided utilizing modular divider stages by selecting the mod_out signal from the most downstream enabled stage as the divide ratio update signal using the strobe_in and strobe_out signals.

Referring back to FIG. 12A, note that the strobe circuitry is different for the first stage 1201 because that stage does not have an enable input. That stage's strobe circuitry includes a single AND gate (1208) rather than the NAND and AND gate for stages that can be disabled shown, e.g., in logic 1206. For a 4-15 divider embodiment, where only the third stage can be disabled, the first stage could omit both the strobe and enable circuit and the second stage would need strobe circuit but could omit the enable circuit.

The divider can be controlled with an unsigned binary integer through the div_ratio signals. The topology is modular allowing one divide ⅔ stage to be designed and then replicated. Its range is no longer limited to a single octave. The power is low because only the first stage's logic is clocked at the maximum frequency. Lastly, it can be updated glitchlessly while running with maximum timing margin.

Thus, various aspects have been described relating to ⅔ dividers. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A divider comprising:
a plurality of ⅔ divider stages configured in a divider chain;
a divider stage of the ⅔ divider stages including a first storage element and a second storage element, the divider stage responsive, in part, to an input enable signal that is deasserted to remain in a disabled state, wherein the divider stage does not toggle when in the disabled state by having each output of the first and second storage elements in the divider stage remain constant and responsive to the input enable signal being asserted to remain in an enabled state; and
wherein a divide range of the divider chain is extended when the divider stage is disabled;
first update clock logic associated with the divider stage and configured to supply as a first update clock logic output signal an inverted version of a modulus output signal from the divider stage for use as an update clock signal responsive to a downstream divider stage adjacent to the divider stage being disabled, and to supply as the first update clock logic output signal an inverted version of a modulus output signal from the downstream divider stage for use as the update clock signal if the downstream divider stage is enabled, and to supply the first update clock logic output signal with a fixed value if the divider stage and the downstream divider stage are disabled;
second update clock logic associated with the downstream divider stage, the second update clock logic configured to supply to the first update clock logic a second update clock logic output signal, the second update clock logic output signal being the inverted version of the modulus output signal from the downstream divider stage if the downstream divider stage is enabled, and if the downstream divider stage is disabled, the second update clock logic is configured to supply the second update clock logic output signal with the fixed value; and
wherein the update clock signal is used to update a divide ratio for the divider.

2. The divider, as recited in claim 1, wherein the divider stage is responsive to a modulus input signal received from a downstream stage being asserted and the input enable signal being deasserted to remain in the disabled state.

3. The divider, as recited in claim 1, wherein the divider stage is implemented as a state machine and a first state of the state machine is a reset state, the reset state being the disabled state, and the state machine in the divider stage is responsive to the input enable signal being deasserted and a modulus input signal being asserted to remain in the reset state, wherein a second state of the state machine is used to divide by two and a third state of the state machine is used for a divide by three once during a period of an output of the divider.

4. The divider, as recited in claim 1, wherein the divider stage in the disabled state is configured to supply an output enable signal to an upstream stage, the output enable signal being a logical combination of the input enable signal and a divide ratio signal supplied to the divider stage.

5. The divider, as recited in claim 1, wherein the divider stage supplies an asserted modulus output signal while in a reset state.

6. The divider, as recited in claim 1, wherein a number of leading zeros in a divide ratio supplied to the divider determines how many of the ⅔ divider stages are disabled and a most significant bit of the divide ratio is supplied as an input enable signal to a most downstream stage of the divider.

7. The divider, as recited in claim 1, wherein the second update clock logic output signal from the downstream divider stage is a strobe-out signal generated by the downstream divider stage, the strobe-out signal being a logical combination of the modulus output signal generated by the downstream divider stage, an input enable signal received by the downstream divider stage, and a strobe-in signal to the downstream divider stage.

8. The divider, as recited in claim 1, wherein one or more of the ⅔ divider stages does not receive an input enable signal.

9. A method of operating a divider with a plurality of ⅔ divider stages comprising:

disabling a divider stage of the ⅔ divider stages responsive to, at least in part, an input enable signal being deasserted to thereby extend a divide range of the divider;

keeping signals generated in the divider stage from toggling when the divider stage is disabled;

generating an update clock signal by supplying from first update clock logic associated with the divider stage a first update clock logic output signal, the first update clock logic output signal being an inverted version of a modulus output signal from the divider stage for use as the update clock signal responsive to a downstream divider stage adjacent to the divider stage being disabled;

supplying from the first update clock logic as the first update clock logic output signal an inverted version of a modulus output signal from the downstream divider stage for use as the update clock signal if the downstream divider stage is enabled;

supplying the first update clock logic output signal with a fixed value if the divider stage and the downstream divider stage are disabled;

supplying from second update clock logic associated with the downstream divider stage to the first update clock logic a second update clock logic output signal, the second update clock logic output signal being the inverted version of the modulus output signal from the downstream divider stage if the downstream divider stage is enabled;

supplying the second update clock logic output signal with the fixed value if the downstream divider stage is disabled; and using the update clock signal to update a divide ratio for the divider.

10. The method as recited in claim 9, further comprising the divider stage remaining in a reset state when disabled.

11. The method, as recited in claim 10, further comprising storage element outputs in the divider stage remaining constant in the reset state.

12. The method, as recited in claim 10, further comprising:
the divider stage remaining in the reset state responsive to the input enable signal being deasserted and a modulus input signal being asserted.

13. The method, as recited in claim 9, further comprising:
the divider stage generating an output enable signal from a logical combination of the input enable signal and a divide ratio signal; and
the divider stage supplying the output enable signal to an upstream divider stage.

14. The method, as recited in claim 10, further comprising the divider stage supplying an asserted modulus out signal while in the reset state.

15. The method, as recited in claim 9, further comprising:
the divider stage receiving a strobe-in signal from the downstream divider stage and supplying a strobe-out signal to an adjacent upstream divider stage for use in generating the update clock signal, wherein the strobe-out signal is the first update clock logic output signal and the strobe-in signal is the second update clock logic output signal.

16. A divider comprising:
a plurality of ⅔ divider stages configured in a divider chain;
a divider stage of the ⅔ divider stages including a first storage element and a second storage element, the divider stage responsive, in part, to a deasserted input enable signal to remain in a disabled state, wherein the divider stage does not toggle when in the disabled state by having each output of the first and second storage elements in the divider stage remain constant;
wherein a divide range of the divider chain is extended when the divider stage is disabled;
wherein an update clock signal to update a divide ratio for the divider is based on a logical combination of a modulus out signal generated by a most downstream stage that is not disabled, an input enable signal received by the most downstream stage that is not disabled, and a signal from an adjacent disabled downstream stage;
first update clock logic associated with a most downstream divider stage of the ⅔ divider stages, the first update clock logic including,
a first NAND gate coupled to a most downstream divider stage input enable signal and a most downstream divider stage modulus output signal;
a first AND gate coupled to an output of the first NAND gate and a logical high input signal;
second update clock logic associated with a second most downstream divider stage of the ⅔ divider stages, the second update clock logic including,
a second NAND gate coupled to a second most downstream divider stage input enable signal and to a second most downstream divider stage modulus output signal; and
a second AND gate coupled to an output of the second NAND gate and coupled to an output of the first AND gate.

* * * * *